(12) United States Patent
Kim

(10) Patent No.: US 7,361,945 B2
(45) Date of Patent: Apr. 22, 2008

(54) SEMICONDUCTOR DEVICE

(75) Inventor: Hyun Jung Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 59 days.

(21) Appl. No.: 11/157,580

(22) Filed: Jun. 21, 2005

(65) Prior Publication Data

US 2006/0211203 A1 Sep. 21, 2006

(30) Foreign Application Priority Data

Mar. 15, 2005 (KR) .................. 10-2005-0021389

(51) Int. Cl.
*H01L 31/072* (2006.01)

(52) U.S. Cl. ........................ 257/192; 257/496

(58) Field of Classification Search ........... 257/496, 257/192
See application file for complete search history.

(56) References Cited

U.S. PATENT DOCUMENTS 5,998,286 A * 12/1999 Chen et al. ................ 438/586
6,215,142 B1 * 4/2001 Lee et al. ................... 257/301
2005/0110074 A1 * 5/2005 Jang et al. .................. 257/327
2006/0086987 A1 * 4/2006 Chen et al. ................. 257/369

* cited by examiner

*Primary Examiner*—Thao P. Le
(74) *Attorney, Agent, or Firm*—Ladas & Parry LLP

(57) ABSTRACT

Disclosed herein are a method of manufacturing a semiconductor device, which can prevent a stepped gate from leaning and increase the channel length of the device, thus contributing to an increase in the degree of integration of the device, as well as a semiconductor device manufactured thereby. The method comprises the steps of: forming in a silicon substrate a isolation film defining an active region; selectively etching each of both sides of the active region to form a first recess and a first protrusion surrounded by the first recess and located at the central portion of the active region; selectively etching the bottom of the first recess and either side of the first protrusion to form a second recess and a second central protrusion surrounded by the second recess; and forming a gate on a portion of the active region extending from each of both edges of the second central protrusion to a portion of the second recess of the active region.

14 Claims, 8 Drawing Sheets

FIELD REGION | ACTIVE REGION | FIELD REGION

FIELD REGION | ACTIVE REGION | FIELD REGION

FIELD REGION | ACTIVE REGION | FIELD REGION

FIELD REGION | ACTIVE REGION | FIELD REGION

FIELD REGION | ACTIVE REGION | FIELD REGION

FIELD REGION   ACTIVE REGION   FIELD REGION

SEMICONDUCTOR DEVICE

BACKGROUND OF THE INVENTION

This application claimed priority of foreign application of Republic of Korea 10-2005-002/389 filed Mar. 15, 2005.

1. Field of the Invention

The present invention relates to a method of manufacturing a semiconductor device having a stepped gate, which can prevent the stepped gate from leaning and increase the channel length of the device, thus contributing to an increase in the degree of integration of the device, as well as a semiconductor device manufactured thereby.

2. Description of the Prior Art

Currently, as the size of a semiconductor device becomes smaller, it is more and more difficult to secure the capacity of a capacitor. Also, as the magnitude of electric field in the junction regions of a transistor becomes larger, it is more and more difficult to secure the refresh characteristics of a cell area. For this reason, a method is used which makes the effective channel length of a transistor long by the use of a three-dimensional cell other than a planar cell.

Particularly, a stepped gate structure was recently proposed which is obtained by forming a recess in a portion both sides of the substrate's active region and then forming a stepped gate on a portion of the active region extending from each edge of the non-recessed portion of the active region to a portion of the recess of the active region. This structure provides an increase in the effective channel length required for the operation of the gate, resulting in an increase in the threshold voltage and an improvement in the refresh characteristics.

FIGS. 1A to 1F are cross-sectional views for explaining each step of a method of manufacturing a semiconductor device having a stepped gate.

As shown in FIG. 1A, the pad oxide film 11 and the pad nitride film 12 are sequentially formed on the silicon substrate 10 having an active region and a field region. Then, the pad nitride film 12 is etched so as to expose the field region, and the pad oxide film 11 and the silicon substrate 10 are etched using the remaining pad nitride film 12 as an etch barrier so as to form the trench 13 in the field region. Then, on the resulting substrate, the gap-fill oxide 14 is formed to fill the trench 13.

As shown in FIG. 1B, the gap-fill oxide film 14 is subjected to chemical mechanical polishing (hereinafter, also referred to as "CMP") until the pad nitride film 12 is exposed.

As shown in FIG. 1C, the remaining pad nitride film 12 and pad oxide film 11 are then removed to form the isolation film 14a, after which the hard mask oxide film 15 is formed on the active region of the substrate 10.

As shown in FIG. 1D, the hard mask oxide film 15 is then etched so as to expose both sides of the active region. Next, both exposed sides of the active region are etched using the remaining hard mask film 15 as an etch barrier so as to form a recess in the active region.

As shown in FIG. 1E, the remaining hard mask oxide film is then removed. Then, the gate oxide film 16 is formed on the active region of the substrate 10. Next, the doped polycrystalline silicon film 17, the tungsten silicide film 18 and the gate hard mask film 19 are sequentially formed on the entire surface of the substrate 10 including the gate oxide film 16.

As shown in FIG. 1F, the gate hard mask film 19 is then etched, leaving a gate pattern. Next, the tungsten silicide film 18, the doped polycrystalline film 17 and the gate oxide film 16 are selectively etched using the remaining gate hard mask film as an etch barrier, thus forming the stepped gate 20 on a portion of the active region extending from each of both edges of the non-recessed central portion and a portion of the recess of the active region.

Although not shown in the drawings, a thermal oxidation process is then performed on the substrate 10 including the gate 20, in order to recover from damage caused by the etching process for forming the gate 20.

However, in the method of manufacturing the semiconductor device having the stepped gate 20 according to the prior art, the volume of the doped polycrystalline film 17 and the tungsten silicide film 18 in the gate 20 shrinks in the high-temperature thermal oxidation process conducted after the formation of the gate 20. Also, since the thickness of a portion of the doped polycrystalline silicon film 17 and the tungsten silicide film 18 placed on the recessed portion of the substrate 10 is greater than the thickness of a portion of the doped polycrystalline silicon film 17 and the tungsten silicide film 18 placed on the non-recessed portion of the substrate 10, then the volume of a portion of the films 17 and 18 placed on the recessed portion of the substrate 10 shink more. Thus, the gates 20 lean inwardly towards the recessed portion of the substrate 10. Accordingly, the interval between the adjacent gates 20 becomes narrower, and thus, contact open failure in the formation of a landing plug contact may occur. Also, an interlayer Insulating film to be formed later may not completely fill the interval between the gates 20 so that the bridge between plugs can occur. As a result, the characteristics of the device will be deteriorated.

And, as the degree of integration of the device continuously increases, there is a limitation in increasing the channel length of the device. Therefore, it will be difficult to fabricate a highly integrated device by the above-described prior method.

SUMMARY OF THE INVENTION

Accordingly, the present invention has been made to solve the above-mentioned problems occurring in the prior art, and it is an object of the present invention to provide a method of manufacturing a semiconductor device, which can prevent the gate from leaning and can increase the channel length of the device, thus contributing to an increase in the degree of integration of the device, as well as a semiconductor device manufactured thereby.

To achieve the above object, in one aspect, the present invention provides a semiconductor device comprising: a silicon substrate; a isolation film formed in the silicon substrate; an active region defined by the isolation film and having a central protrusion which extends over the central portion of the length of a channel and either side of the width of the channel, the central protrusion being formed by etching both sides of the active region so as to form a first recess while leaving a first protrusion surrounded by the first recess and located at the central portion of the active region, and then selectively etching the bottom of the first recess of the active region and either side of the first protrusion to form a second recess surrounding the central protrusion; and a stepped gate formed on a portion of the active region extending from each of both edges of the central protrusion to a portion of the second recess of the active region.

In the inventive semiconductor device, the first recess preferably has a depth of 100-400 Å, and the second recess preferably has a depth of 100-400 Å.

In another aspect, the present invention provides a method of manufacturing a semiconductor device, the method comprising the steps of: forming in a silicon substrate a isolation film defining an active region; selectively etching each of both sides of the active region to form a first recess while leaving a first protrusion surrounded by the first recess and located at the central portion of the active region; selectively etching the bottom of the first recess and either side of the first protrusion to form a second recess while leaving a second protrusion surrounded by the second recess; and forming a gate on a portion of the active region extending from each of both edges of the central protrusion to a portion of the second recess of the active region.

In the inventive method, the step of forming the isolation film preferably comprises the sub-steps of: sequentially forming a pad oxide film and a pad nitride film on the substrate; etching the pad nitride film so as to expose the field region of the substrate; etching the pad oxide film and the substrate using the remaining pad nitride film as an etch barrier so as to form a trench; forming a gap-fill oxide film on the resulting substrate to fill the trench; subjecting the gap-fill oxide film to chemical mechanical polishing (CMP) until the pad nitride film is exposed; and removing the remaining pad nitride film and pad oxide film.

Also, the trench is preferably formed to a depth of 2,000-3,000 Å.

Also, the first recess of the active region is preferably formed to a depth of 100-400 Å.

Also, the second recess of the active region is preferably formed to a depth of 100-400 Å.

Also, the step of forming the gate preferably comprises the sub-steps of: forming a gate oxide film on the two-step-recessed active region of the substrate; sequentially forming a doped polycrystalline silicon film, a tungsten silicide film and a gate hard mask film on the entire surface of the substrate including the gate oxide film; etching the gate hard mask film so as to leave a gate pattern; and etching the tungsten silicide film and the doped polycrystalline silicon film using the remaining gate hard mask film as an etch barrier.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described in detail with reference to the accompanying drawings.

Figure 1A:
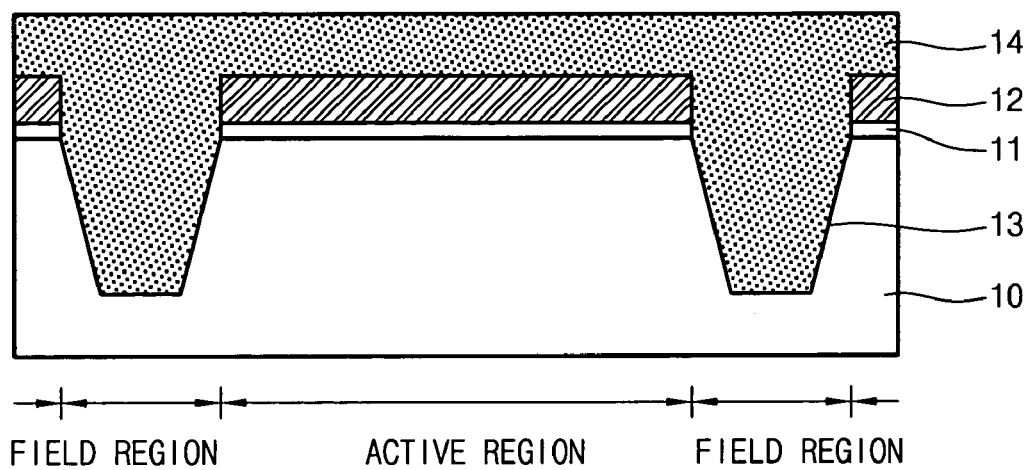
FIGS. 1A to 1F are cross-sectional views for explaining each step of a method of manufacturing a semiconductor device having a stepped gate, according to the prior art.
Figure 1B:
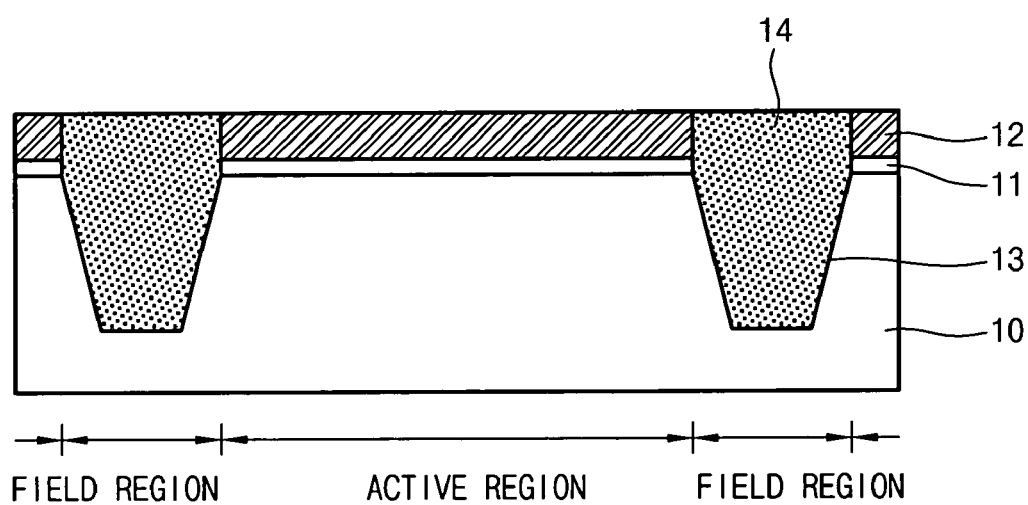
Figure 1C:
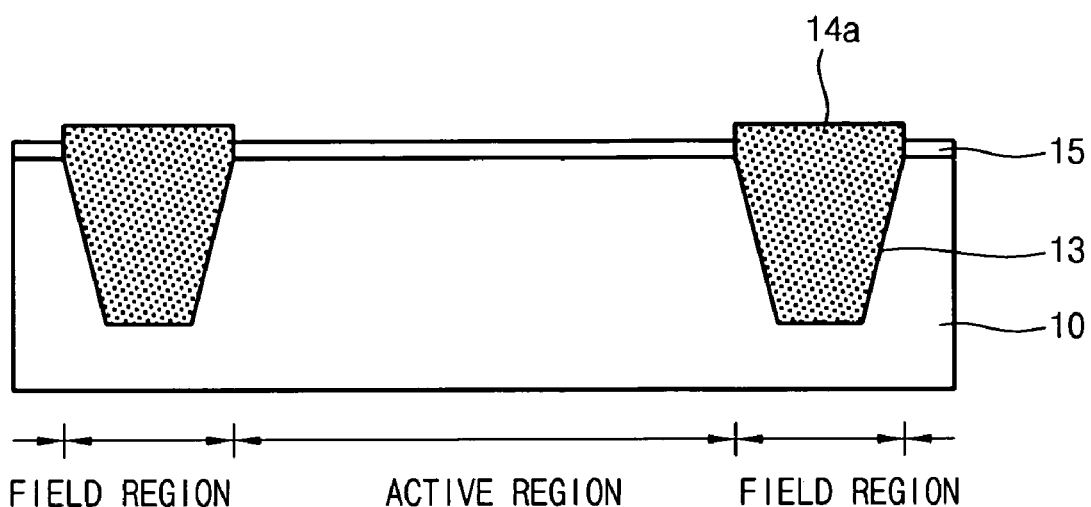
Figure 1D:
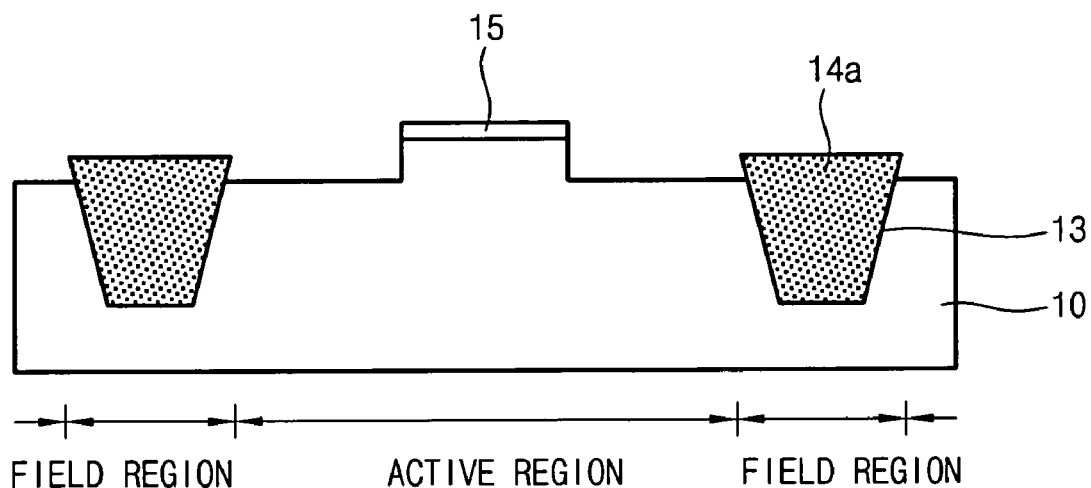
Figure 1E:
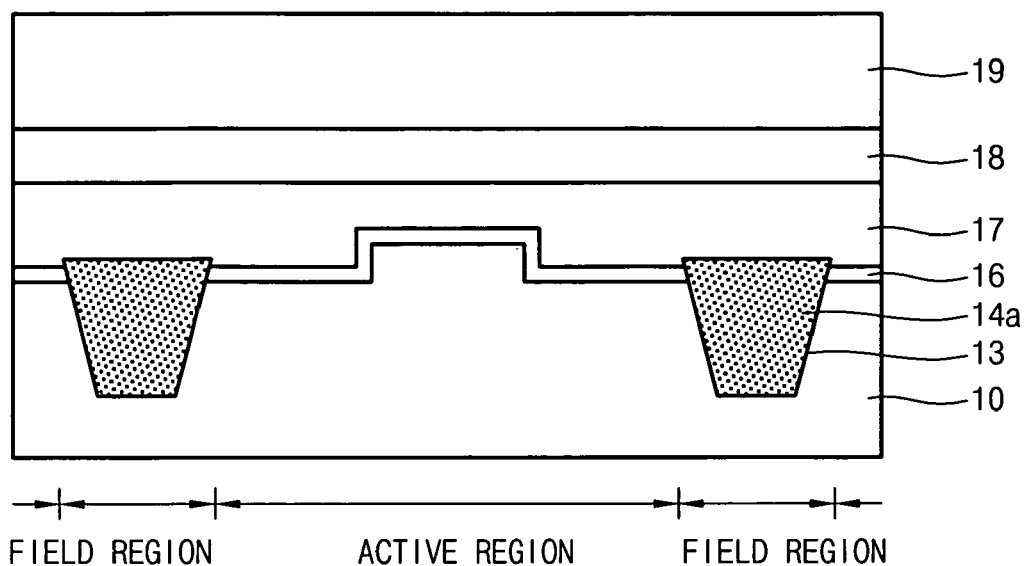
Figure 1F:
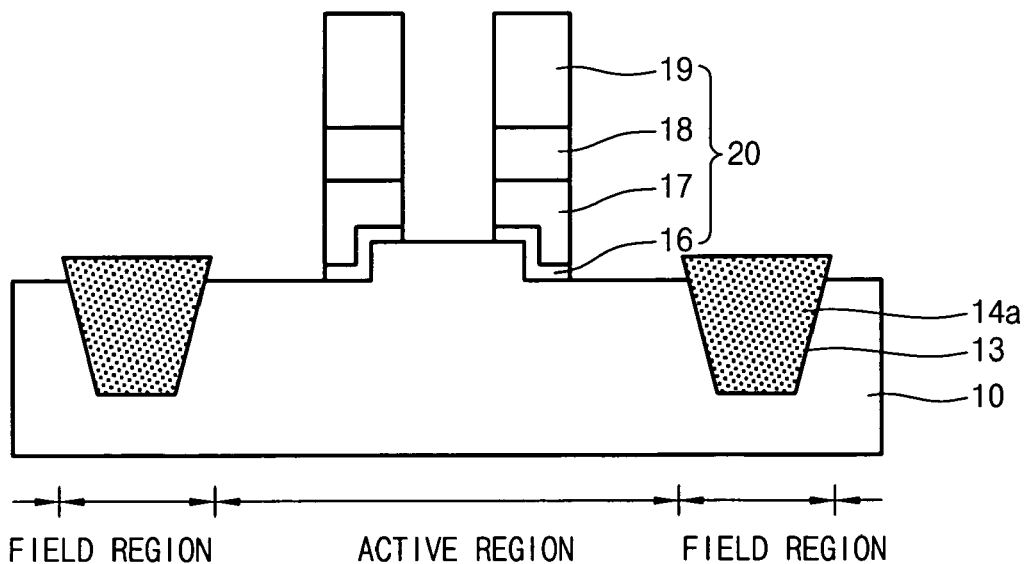
Figure 2A:
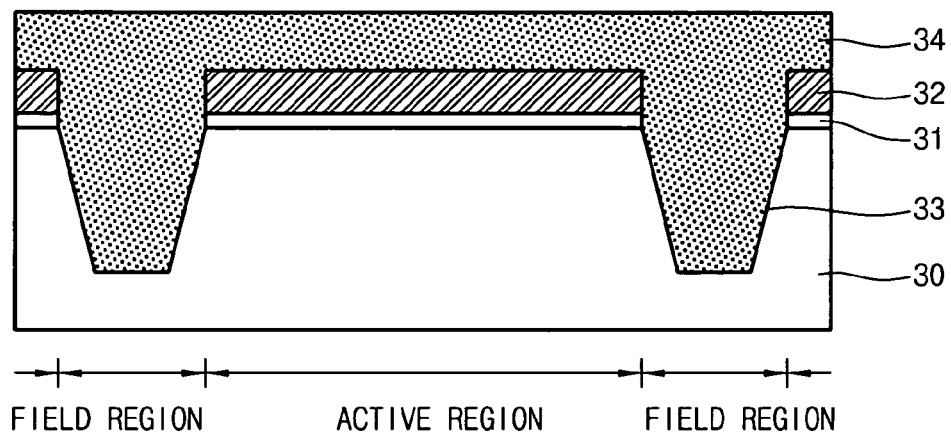
FIGS. 2A to 2G are cross-sectional views for explaining each step of a method of manufacturing a semiconductor device according to the present invention.
Figure 2B:
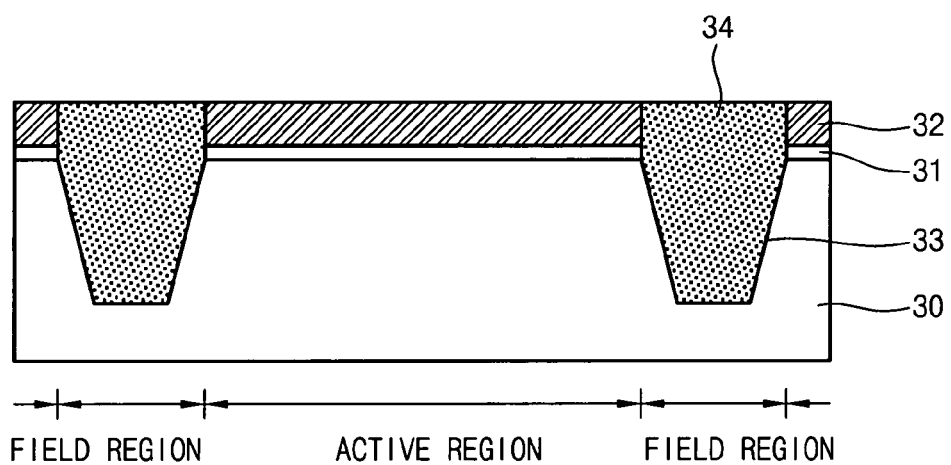
Figure 2C:
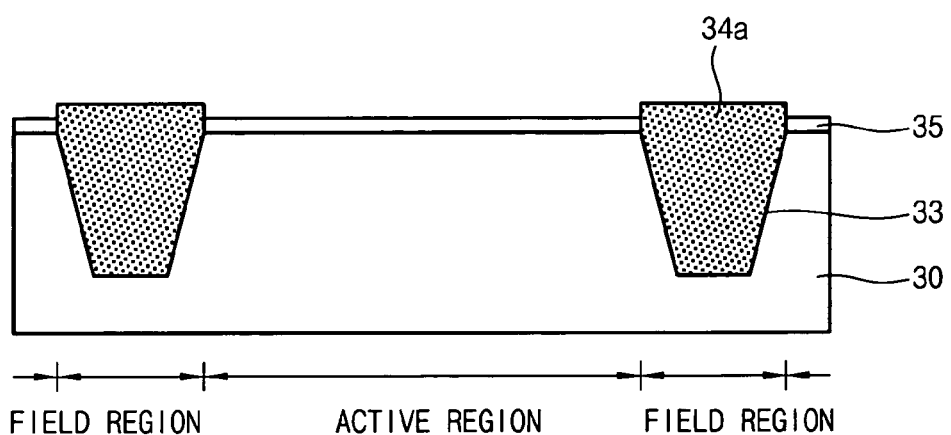
Figure 2D:
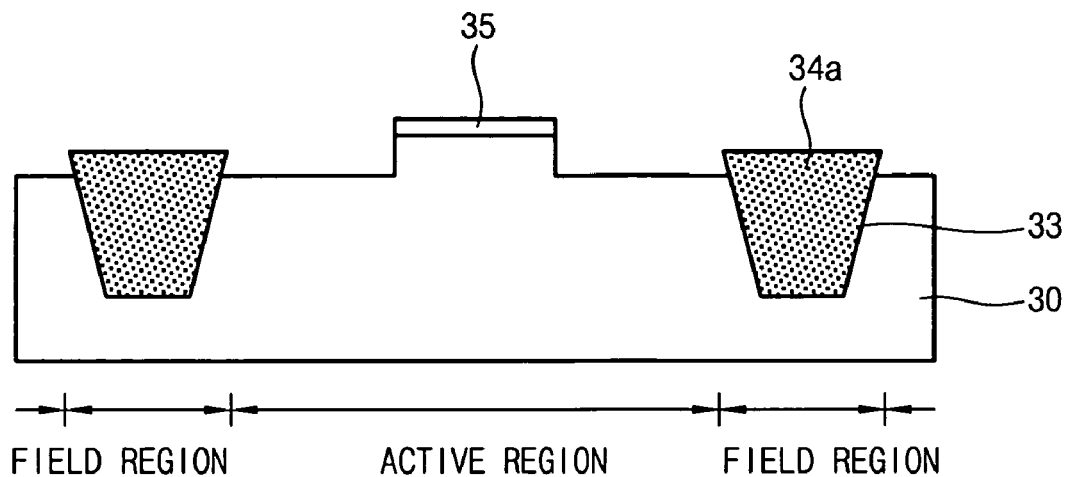
Figure 2E:
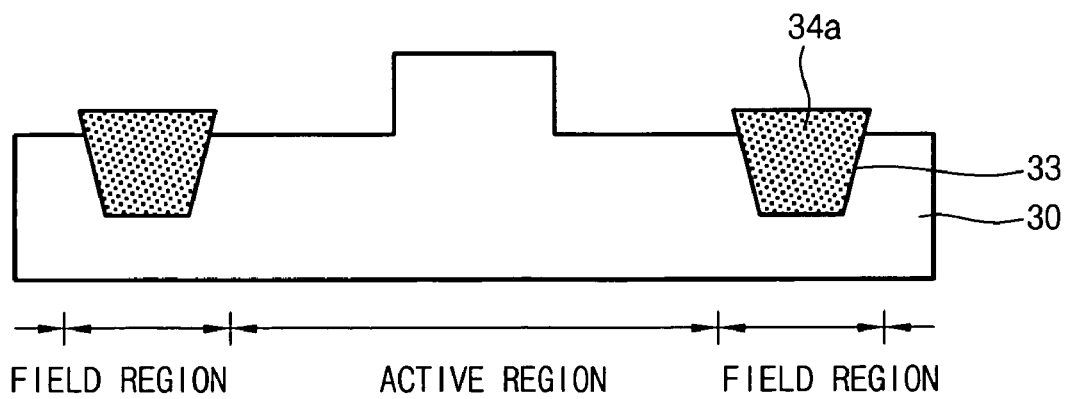
Figure 2F:
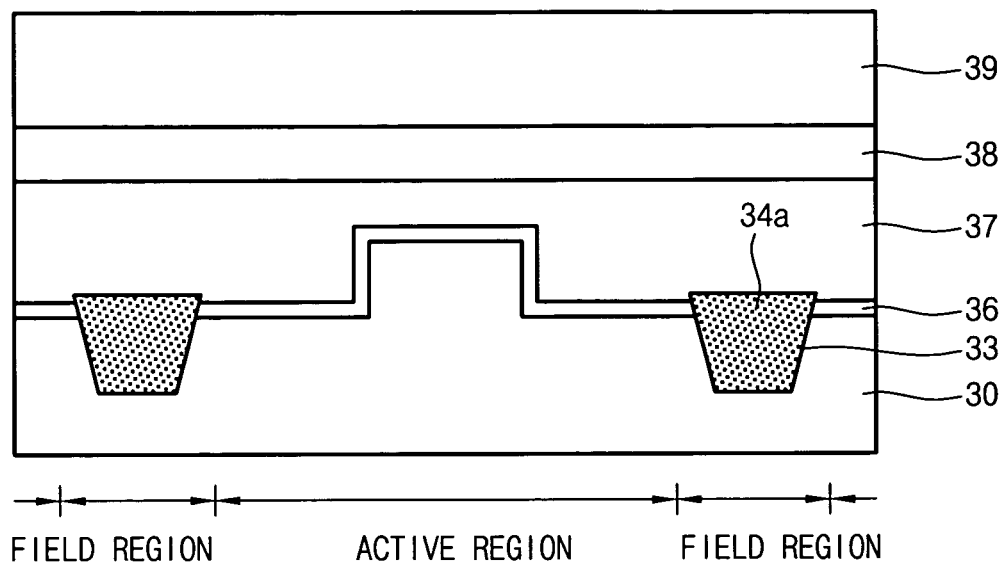
Figure 2G:
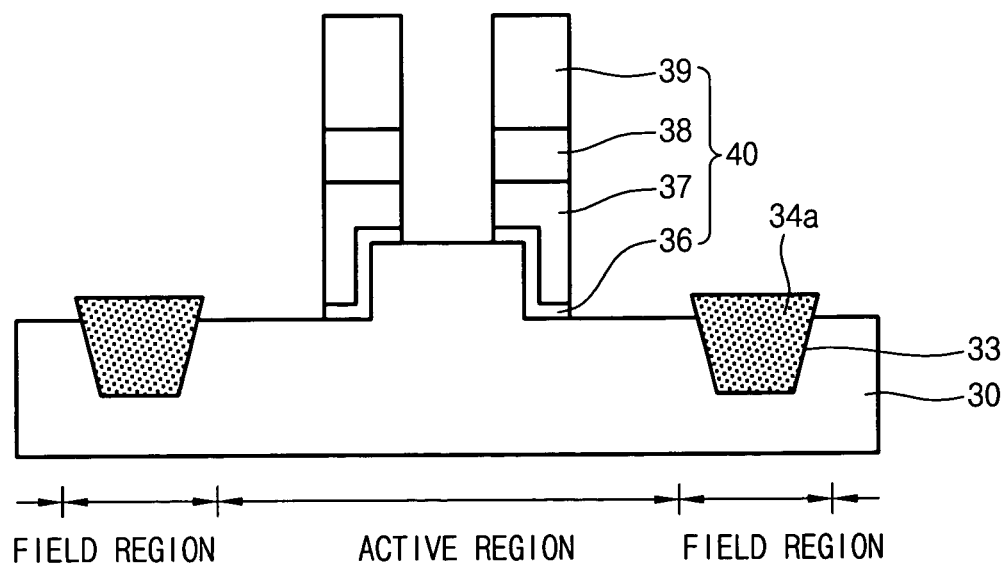
Figure 3:
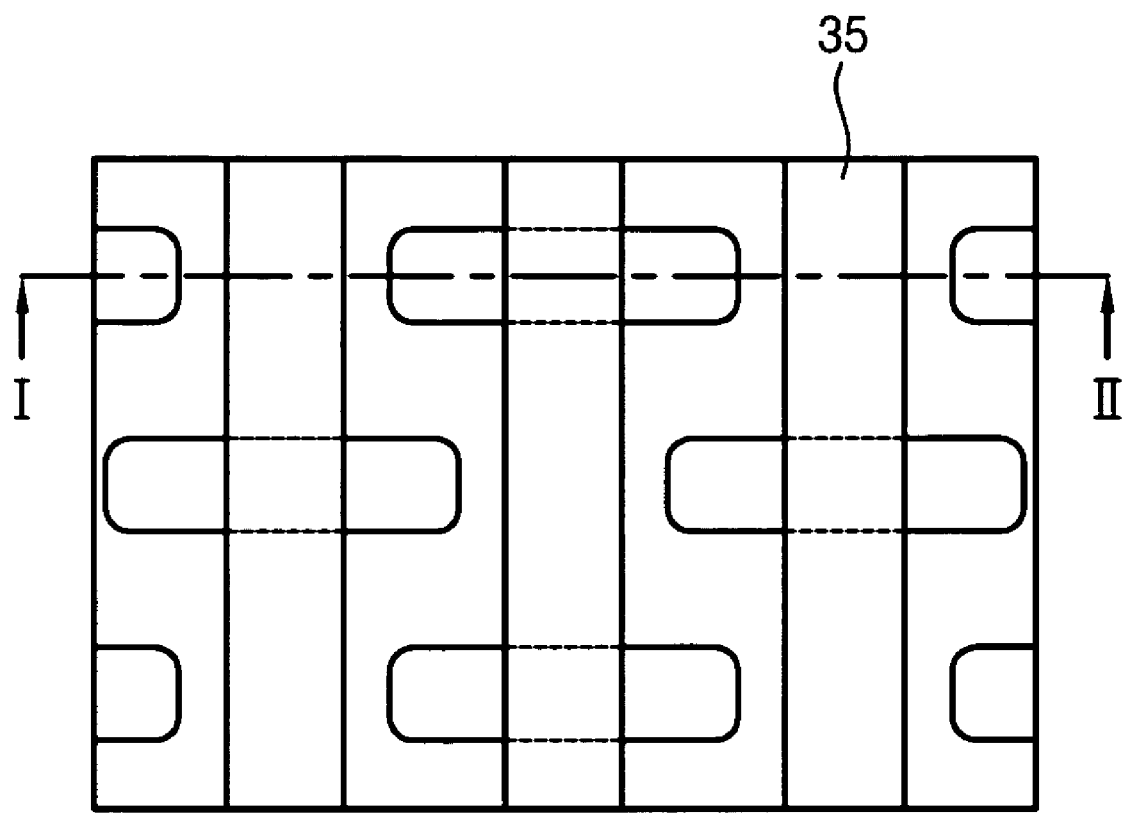
FIG. 3 is a top view of FIG. 2D.
Figure 4:
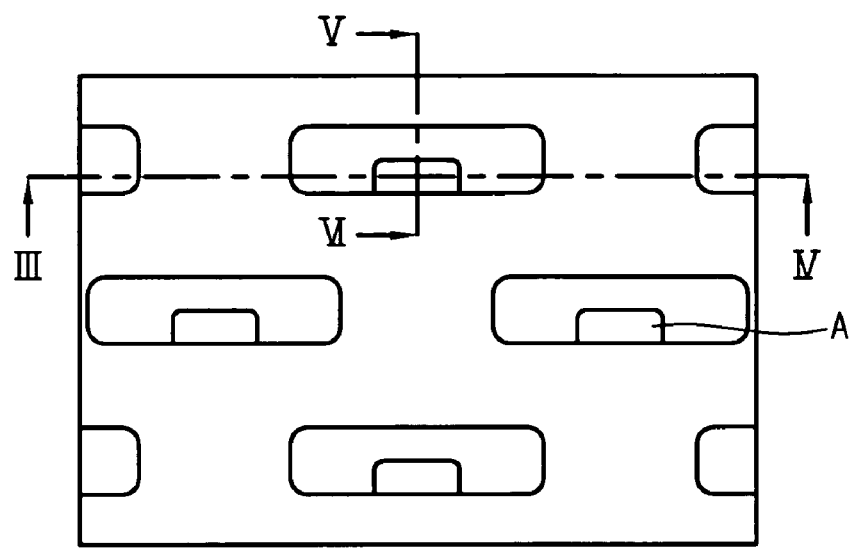
FIG. 4 is a top view of FIG. 2E.

FIGS. 2A to 2G are cross-sectional views for explaining each step of a method of manufacturing a semiconductor device having a stepped gate, according to the present invention, FIG. 3 is a top view of FIG. 2D, and FIG. 4 is a top view of FIG. 2E.

As shown in FIG. 2A, the pad oxide film 31 and the pad nitride film 32 are sequentially formed on the silicon substrate 30 having an active region and a field region. The pad oxide film 31 is formed to a thickness of about 50-100 Å, and the pad nitride film 32 is formed to a thickness of about 500-800 Å. Then, the pad nitride film 32 is partially etched so as to expose the field region, and the pad oxide film 31 and the silicon substrate 30 is etched using the remaining pad oxide film 32 as an etch barrier so as to form the trench 33 in the field region. The trench 33 is formed to a depth of 2,000-3,000 Å. Then, on the resulting substrate, the gap-fill oxide film 34 is formed to fill the trench 33.

As shown in FIG. 2B, the gap-fill oxide film 34 is then subjected to chemical mechanical polishing (CMP) until the pad nitride film 32 is exposed.

As shown in FIG. 2C, the remaining pad nitride film 32 and pad oxide film 31 are then removed, thus forming the isolation film 34a. Then, the hard mask oxide film 35 is formed on the active region of the substrate 30. Alternatively, the remaining pad oxide film 31 may also be substituted for the hard mask oxide film 35 without removal.

As shown in FIGS. 2D and 3, the hard mask oxide film 35 is then partially etched so as to expose both sides of the active region. Then, both exposed sides of the active region are etched using the remaining hard mask oxide film 35 as an etch barrier, thus forming a first recess and a first protrusion surrounded by the first recess and located at the central portion of the active region.

In this regard, FIG. 2D is a cross-sectional view taken along line I-II (channel length direction) in FIG. 3. The first recess of the active region of the substrate 30 is etched to a depth of 100-400 Å, and thus, the channel length of the device is increased.

Figure 5:
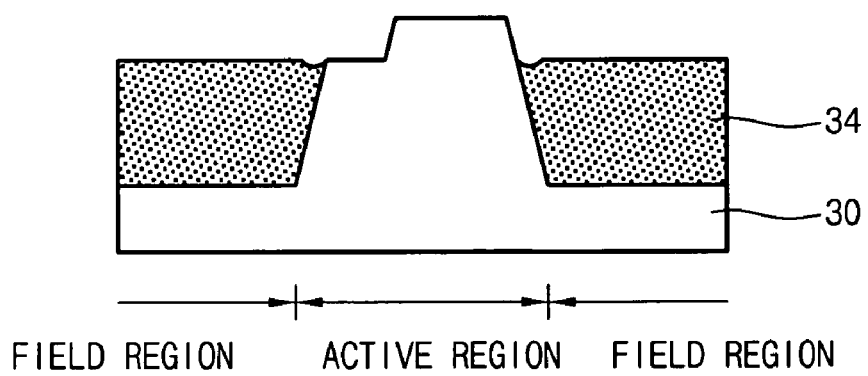
FIG. 5 is a cross-sectional view taken along line V-VI in FIG. 4.

As shown in FIGS. 2E, 4 and 5, the remaining hard mask oxide film 35 is removed. Thereafter, the bottom of the first recess and either side of the first protrusion are selectively etched to form a second protrusion which extends over the central portion of the length of the channel and either side of the width of the channel.

In this regard, FIG. 2E is a cross-sectional view taken along line III-IV (channel length direction) in FIG. 4, and FIG. 5 is a cross-sectional view taken along line V-VI (channel width direction) in FIG. 4. The second recess of the active region is formed to a depth of 100-400 Å, and thus, the channel length and width of the device are additionally increased.

Thereafter, although not shown in the drawings, a screen oxide film (not shown) is formed on the two-step-recessed active region of the substrate 30. Following this, a well ion implantation process and a channel ion implantation process into the substrate 30 are sequentially performed.

As shown in FIG. 2F, the gate oxide film 36 is then formed on the active region of the resulting substrate 30. The gate oxide film 36 is formed to a thickness of 30-50 Å. Then, the doped polycrystalline silicon film 37, the tungsten silicide film 38 and the gate hard mask film 39 are sequentially formed on the entire surface of the substrate 30 including the gate oxide film 36. The doped polycrystalline silicon film is formed to a thickness of 400-700 Å, the tungsten silicide film 38 is formed to a thickness of 1,000-1,500 Å, and the gate hard mask film 39 is formed to a thickness of 2,000-2,500 Å.

As shown in FIG. 2G, the gate hard mask film 39 is partially etched, leaving a gate pattern. Then, the tungsten silicide film 38 and the doped polycrystalline silicon film 37 are etched using the remaining gate hard mask film as an etch barrier, thus forming the stepped gate 40 on the active region of the substrate 30. In this regard, the stepped gate 40 is located at a portion of the active region extending from each of both edges of the central protrusion to a portion of the second recess.

Thereafter, although not shown in the drawings, the silicon substrate 30 including the gate 40 is subjected to a thermal oxidation process in order to recover from damage caused by the etching process for forming the gate 40. Following this, a series of known subsequent processes are sequentially performed, thus completing the manufacturing of the inventive semiconductor device.

As described above, according to the present invention, the stepped gate 40 is formed in a state where the recessed area of the substrate 30 has been increased by the two-step-recess process as compared to that in the prior art. For this reason, the stepped gate 40 can be prevented from leaning due to the thermal oxidation process conducted after the formation of the stepped gate 40, and the length of channel can be further increased, resulting in improvements in the refresh characteristics and operating speed of the device.

As can be seen from the foregoing, according to the present invention, a portion of the active region of the substrate is recessed so as to increase the channel length, and then, additionally recessed. Accordingly, the present invention can prevent the stepped gate from leaning and can improve the refresh characteristics and operating speed of the device, thus contributing to an increase in the degree of integration of the device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor device having a substrate with an active region defined by an isolation film on the device, the device comprising:
    a central protrusion in the active region, the central protrusion having two opposing lateral sides approximately perpendicular to a length of the active region and having two opposing longitudinal sides approximately parallel to the length of the active region wherein only one longitudinal side of the central protrusion is not contiguous to an adjacent longitudinal side of the active region; and
    a stepped gate on a portion of each lateral side of the central protrusion to a portion of a second recess of the active region,
    wherein the stepped gate has an increased height which provides an increased recessed area between the stepped gate and the protrusion to prevent the stepping gate from leaning.

2. The semiconductor device of claim 1, wherein the central protrusion being formed by etching both lateral sides along the length of the active region so as to form a first recess in the active region while leaving a first protrusion surrounded by the first recess and then selectively etching the bottom of the first recess and etching either longitudinal side of the first protrusion to form the second recess surrounding the central protrusion.

3. The semiconductor device of claim 2, wherein the first recess has a depth of 100-400 Å.

4. The semiconductor device of claim 1, wherein the second recess has a depth of 100-400 Å.

5. The semiconductor device of claim 1, wherein the substrate is silicon.

6. The semiconductor device of claim 1, wherein the isolation film is an oxide of silicon.

7. The semiconductor device of claim 1, wherein the isolation film having a trench depth of about 2,000-3,000 Å.

8. The semiconductor device of claim 1 wherein the stepped gate comprising a gate oxide film.

9. The semiconductor device of claim 1 wherein the stepped gate comprising a doped polycrystalline film.

10. The semiconductor device of claim 1 wherein the stepped gate comprising a metal silicide film on a portion of the active region.

11. The semiconductor device of claim 10 wherein the metal silicide film is tungsten silicide film.

12. The semiconductor device of claim 8 wherein the stepped gate further comprising a doped polycrystalline film on a portion of the gate oxide film.

13. The semiconductor device of claim 12 wherein the stepped gate further comprising a metal silicide film on a portion of the doped polycrystalline film.

14. The semiconductor device of claim 13 wherein the metal silicide film is tungsten silicide film.

* * * * *